(12) United States Patent
Yamamoto et al.

(10) Patent No.: US 6,344,678 B1
(45) Date of Patent: Feb. 5, 2002

(54) SEMICONDUCTOR DEVICE COMPRISING TRANSISTOR

(75) Inventors: Fumitoshi Yamamoto; Tomohide Terashima, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/520,000

(22) Filed: Mar. 6, 2000

(30) Foreign Application Priority Data

Sep. 9, 1999 (JP) .......................................... 11-255430

(51) Int. Cl.⁷ ............................................. H01L 27/082
(52) U.S. Cl. ....................................... 257/592; 257/587
(58) Field of Search ................................ 257/587, 591, 257/592

(56) References Cited

U.S. PATENT DOCUMENTS 4,339,765 A * 7/1982 Nakamura et al. .......... 257/561
5,015,594 A * 5/1991 Chu et al. .................... 438/207
5,296,388 A * 3/1994 Kameyama et al. ......... 438/370

FOREIGN PATENT DOCUMENTS

JP          8-31843         2/1996

* cited by examiner

*Primary Examiner*—Allan R. Wilson
(74) *Attorney, Agent, or Firm*—McDermott, Will & Emery

(57) ABSTRACT

An $n^-$ epitaxial layer serving as a collector region is formed on a p-type silicon substrate. A p diffusion layer serving as a base region is formed on the $n^-$ epitaxial layer. An $n^-$ diffusion layer and an $n^+$ diffusion layer defining an emitter region are formed on the p diffusion layer. A $p^+$ diffusion layer serving as a base contact region for attaining contact with the p diffusion layer is formed with a prescribed interval between the same and the emitter region. Thus obtained is a semiconductor device comprising a transistor suppressing dispersion of a current amplification factor.

4 Claims, 17 Drawing Sheets

FIG.9 hFE(Ic=50 μA) a [μm]

| | 0.1 | 0.2 | 0.3 | 0.4 | 0.5 | 0.6 | 0.7 | 0.8 | 0.9 | 1.0 | 1.1 | 1.2 | 1.3 | 1.4 | REF |
|---|---|---|---|---|---|---|---|---|---|---|---|---|---|---|---|
| MEASURING PORTION 1 | 23.4 | 69.8 | 70.2 | 69.7 | 69.5 | 67.0 | 66.9 | 65.9 | 63.8 | 63.5 | 63.4 | 63.0 | 64.3 | 66.0 | 66.0 |
| MEASURING PORTION 2 | 57.4 | 83.5 | 85.7 | 87.7 | 86.8 | 86.7 | 87.4 | 86.5 | 86.2 | 89.3 | 87.6 | 88.4 | 93.8 | 96.3 | 95.8 |
| MEASURING PORTION 3 | 18.6 | 80.8 | 83.0 | 80.8 | 81.7 | 80.8 | 79.9 | 80.6 | 82.1 | 79.7 | 81.2 | 82.6 | 84.6 | 89.8 | 91.7 |
| MEASURING PORTION 4 | 68.3 | 78.9 | 79.6 | 79.2 | 77.7 | 76.1 | 74.9 | 72.2 | 71.7 | 70.6 | 69.8 | 67.0 | 65.6 | 57.9 | 60.2 |
| MEASURING PORTION 5 | 25.6 | 87.9 | 86.8 | 84.5 | 79.0 | 75.9 | 72.5 | 67.7 | 65.4 | 63.3 | 60.7 | 58.5 | 53.4 | 49.9 | 51.7 |
| AVERAGE | 38.66 | 80.18 | 81.06 | 80.38 | 78.94 | 77.30 | 76.32 | 74.58 | 73.84 | 73.28 | 72.54 | 71.90 | 72.34 | 71.97 | 73.08 |
| σ | 19.35 | 4.66 | 4.93 | 4.74 | 4.27 | 5.16 | 5.86 | 7.18 | 8.25 | 8.98 | 9.49 | 10.88 | 13.49 | 16.84 | 16.54 |

※ REF: WITH NO P + SD

SEMICONDUCTOR DEVICE COMPRISING TRANSISTOR

BACKGROUND OF THE INVENTION

1. Field of the Invention

The present invention relates to a semiconductor device comprising a transistor, and more particularly, it relates to a semiconductor device comprising a transistor capable of suppressing dispersion of the current amplification factor of the transistor.

2. Description of the Prior Art

An exemplary conventional semiconductor device comprising transistors employed for diving/controlling a motor or an air bag for a car, for example, is described. In this type of semiconductor device, a bipolar transistor and MOS transistors are formed on the same semiconductor substrate. The structure of a portion forming the bipolar transistor is now described.

Referring to FIG. 12, an n⁻ epitaxial layer 4 is formed on a p-type silicon substrate 1. An n⁺ diffusion layer 2a and a p⁺ diffusion layer 3 are formed between the p-type silicon substrate 1 and the n⁻ epitaxial layer 4. A p⁺ diffusion layer 5a and LOCOS oxide films 6 for electrically isolating this portion from another element region (not shown) are formed on the n⁻ epitaxial layer 4.

A p diffusion layer 6 is formed on the surface of the n⁻ epitaxial layer 4 and in the vicinity thereof. An n⁻ diffusion layer 8b and an n⁺ diffusion layer 9b are formed on the surface of the p diffusion layer 7 and in the vicinity thereof. A p⁺ diffusion layer 100 for attaining contact with the p diffusion layer 7 is formed on the p diffusion layer 7.

Further, an n⁻ diffusion layer 8a and an n⁺ diffusion layer 9a for attaining contact with the n⁻ epitaxial layer 4 are formed on the surface of the n⁻ epitaxial layer 4 and in the vicinity thereof.

The n⁻ epitaxial layer 4 defines a collector region in the bipolar transistor, the p diffusion layer 7 and the p⁺ diffusion layer 100 define a base region, and the n⁻ diffusion layer 8b and the n⁺ diffusion layer 9b define an emitter region.

An interlayer insulation film 11 is formed to cover the p diffusion layer 7 and the LOCOS oxide films 6. A contact hole 12a exposing the surface of the n⁺ diffusion layer 9a is formed in the interlayer insulation film 11. Further, a contact hole 12b is formed to expose the surface of the p⁺ diffusion layer 100. In addition, a contact hole 12c is formed to expose the surface of the n⁺ diffusion layer 9b.

A collector electrode 13a electrically connected with the n⁺ diffusion layer 9a is formed in the contact hole 12a. A base electrode 13b electrically connected with the p⁺ diffusion layer 100 is formed in the contact hole 12b. An emitter electrode 13c electrically connected with the n⁺ diffusion layer 9b is formed in the contact hole 12c.

Other semiconductor elements such as MOS transistors are formed on another element forming region (not shown) electrically isolated from this region formed with the bipolar transistor by the LOCOS oxide films 6 and the like.

A method of fabricating the semiconductor device having the aforementioned bipolar transistor is described along with a method of fabricating MOS transistors. Referring to FIG. 13, prescribed n⁺ diffusion layers 2a and 2b, the p⁺ diffusion layer 3 and the n⁻ epitaxial layer 4 are formed on the p-type silicon substrate 1. Phosphorus is injected into a prescribed region of the n⁻ epitaxial layer 4, thereby forming an n⁻ diffusion layer 14 for forming a p-channel MOS transistor.

Further, boron is injected into other prescribed regions of the n⁻ epitaxial layer 4, thereby forming a p⁺ diffusion layer 5b for forming an n-channel MOS transistor and a p⁺ diffusion layer 5a for element isolation.

Then, the LOCOS oxide films 6 are formed on prescribed regions of the n⁻ epitaxial layer 4. A gate electrode 19a formed by a polysilicon film 16a and a tungsten silicide film 17a is formed on the n⁻ diffusion layer 14 through a gate insulator film 151a. At the same time, a gate electrode 19b formed by a polysilicon film 16b and a tungsten silicide film 17b is formed on the p⁺ diffusion layer 5b through a gate insulator film 151b.

Then, boron is injected into a prescribed region of the n⁻ epitaxial layer 4, thereby forming the p diffusion layer 7 partially forming the base region of the bipolar transistor.

The gate electrode 19b and a prescribed photoresist pattern (not shown) are employed as masks for injecting a prescribed impurity, thereby forming the n⁻ diffusion layers 8a and 8b and n⁻ diffusion layers 8c and 8d respectively. Side wall insulator films 18a are formed on both side surfaces of the gate electrode 19a, and side wall insulator films 18b are formed on both side surfaces of the gate electrode 19b.

The gate electrode 19b, the side wall insulator films 18b and a prescribed photoresist pattern 200 are employed as masks for injecting a prescribed impurity, thereby forming the n⁺ diffusion layers 9a and 9b and n⁺ diffusion layers 9c and 9d respectively.

Referring to FIG. 14, the photoresist pattern 200 is removed and heat treatment is performed in a nitrogen atmosphere. Referring to FIG. 15, a photoresist pattern 202 exposing part of the surface of the p diffusion layer 7 and the surface of the n⁻ diffusion layer 14 is formed on the n⁻ epitaxial layer 4.

The photoresist pattern 202 is employed as a mask for injecting a prescribed impurity, thereby forming the p⁺ diffusion layer. 100 on the surface of the p diffusion layer 7 and in the vicinity thereof. P⁺ diffusion layers 10b and 10c are formed on the n⁻ diffusion layer 14. Thereafter the photoresist pattern 200 is removed.

Thus formed is a bipolar transistor T1 having the collector region defined by the n⁻ epitaxial layer 4, the base region defined by the p diffusion layer 7 and the p⁺ diffusion layer 100 and the emitter region defined by the n⁻ diffusion layer 8b and the n⁺ diffusion layer 9b. Further, a p-channel MOS transistor T2 is formed with source/drain regions defined by the p⁺ diffusion layers 10b and 10c. In addition, an n-channel MOS transistor T3 is formed with source/drain regions defined by the n⁻ diffusion layers 8c and 8d and the n⁺ diffusion layers 9c and 9d.

Referring to FIG. 16, the interlayer insulating film 11 formed by a silicon oxide film, for example, is formed on the n⁻ epitaxial layer 4 by CVD or the like. A prescribed photoresist pattern (not shown) is formed on the interlayer insulating film 11.

The photoresist pattern is employed as a mask for anisotropically etching the interlayer insulating film 11, thereby forming the contact holes 12a, 12b and 12c and contact holes 12d, 12e, 12f and 12g respectively. Thereafter the electrodes 13a to 13c and prescribed electrodes 13d to 13g are formed in the contact holes 12a to 12g respectively.

A principal part of the semiconductor device comprising the bipolar transistor T1 and the MOS transistors T2 and T3 is completed through the aforementioned steps.

However, the semiconductor device obtained in the aforementioned method has the following problem: When evaluating collector current dependency of a current amplification factor $h_{FE}$ particularly in the bipolar transistor T1 in the aforementioned semiconductor device, the current amplification factor $h_{FE}$ proved to remarkably disperse in the wafer plane. This problem is now described.

FIGS. 17B to 17F are graphs showing values of the current amplification factor $h_{FE}$ of the bipolar transistor T1 evaluated on five points of the wafer plane shown in FIG. 17A respectively. It is understood from these graphs that the values of the current amplification factor $h_{FE}$ for a specific collector current vary and disperse in the wafer plane.

The current amplification factor $h_{FE}$ is defined as the ratio ($I_C/I_B$) of the collector current to a base current. In order to investigate the cause for such dispersion of the current amplification factor $h_{FE}$, base-to-emitter voltage dependency of the collector current and base-to-emitter voltage dependency of the base current were evaluated respectively.

Referring to FIG. 18 showing partial results of the evaluation, results on the points 5 and 3 exhibiting the largest changes among the five points in the wafer plane are plotted on the same graph. As shown in FIG. 18, the curves are substantially consistent with each other as to the base-to-emitter voltage dependency of the collector current, and it is conceivable that dispersion of the collector current in the wafer plane is extremely small.

Noting the curves showing the base-to-emitter voltage dependency of the base current, it is understood that the curves at the points 5 and 3 are inconsistent with each other. In other words, it is understood that the base current disperses in the wafer plane. Thus, it is conceivable that dispersion of the current amplification factor $h_{FE}$ results from such dispersion of the base current.

SUMMARY OF THE INVENTION

The present invention has been proposed in order to solve the aforementioned problem, and an object thereof is to provide a semiconductor device comprising a transistor, in which dispersion of a current amplification factor is reduced by suppressing dispersion of a base current.

The semiconductor device according to the present invention comprises a transistor. The transistor includes a first conductivity type collector region, a second conductivity type base region, a first conductivity type emitter region and a second conductivity type base contact region. The collector region is formed on a semiconductor substrate. The base region is formed on the surface of the collector region and in the vicinity thereof, and has a first impurity concentration. The emitter region is formed on the surface of the base region and in the vicinity thereof. The base contact region is formed on the surface of the base region and in the vicinity thereof, and has a second impurity concentration, higher than the first impurity concentration, for attaining contact with the base region. The base contact region and the emitter region are arranged at a prescribed interval while the base contact region extends toward the emitter region so that dispersion of values of a current amplification factor of the transistor is within a prescribed range.

According to this structure, the base contact region having a relatively high impurity concentration formed on the surface of the base region reduced in impurity concentration due to out diffusion of the impurity during the fabrication steps extends toward the emitter region for supplying a sufficient amount of the impurity to the base region as compared with the conventional semiconductor device. The base contact region and the emitter region are arranged at a prescribed interval for reducing dispersion of the base current, thereby reducing dispersion of the values of the current amplification factor of the transistor within the prescribed range.

As to the range of dispersion of the values of the current amplification factor, the value of average absolute deviation of the current amplification factor on five points in the wafer plane is preferably not more than 5 as a representative value.

If the value of average absolute deviation of the current amplification factor is not more than 5, it is conceivable that dispersion of the current amplification factor of the transistor is very small.

The prescribed interval between the base contact region and the emitter region is preferably at least 0.2 $\mu$m and not more than 0.5 $\mu$m.

If the interval is shorter than 0.2 $\mu$m and not more than 0.5 $\mu$m, the value of average absolute deviation of the current amplification factor disadvantageously exceeds 5. Therefore, the interval is preferably at least 0.2 $\mu$m and not more than 0.5 $\mu$m.

The base contact region is preferably formed to enclose the emitter region on the surface of the base region while keeping the prescribed interval between the same and the emitter region.

In this case, flows of electrons or holes in the base region and the emitter region are uniformalized for stabilizing operations of the transistor.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 illustrates values of the current amplification factor of the bipolar transistor in the semiconductor device shown in FIG. 1 and values of standard deviation thereof;

DESCRIPTION OF THE PREFERRED EMBODIMENT

Figure 1:
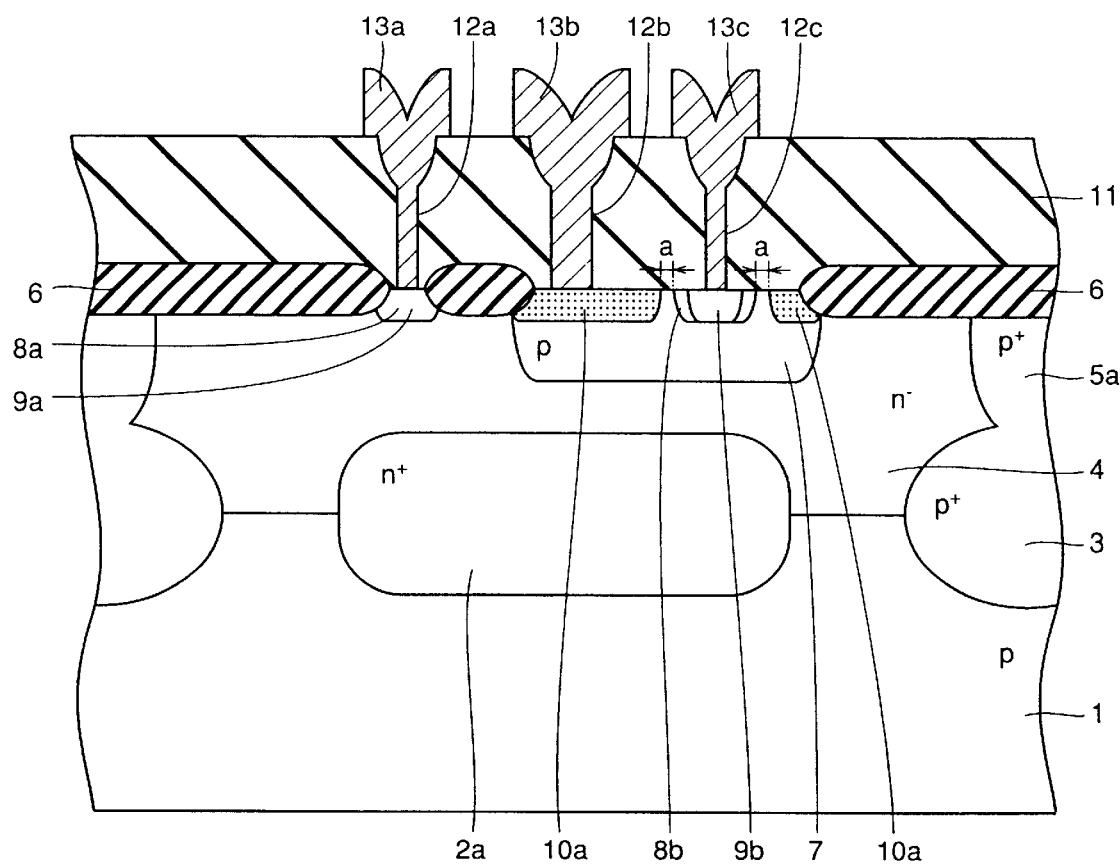
FIG. 1 is a sectional view of a semiconductor device according to an embodiment of the present invention.

A semiconductor device according to an embodiment of the present invention is described with reference to the drawings. First, the structure of a portion forming a bipolar transistor is described. Referring to FIG. 1, an n⁻ epitaxial layer 4 having an impurity concentration of up to $10^{15}$ atoms/cm³ is formed on a p-type silicon substrate 1. An n⁺ diffusion layer 2a having an impurity concentration of up to $10^{21}$ atoms/cm³ is formed in the vicinity of the interface between the n⁻ epitaxial layer 4 and the p-type silicon substrate 1.

Further, p⁺ diffusion layers 5a and 3 having impurity concentrations of up to $10^{18}$ atoms/cm³ are formed on the n⁻ epitaxial layer 4 for electrically isolating this portion from another element. In addition, LOCOS oxide films 6 are formed on prescribed regions of the surface of the n⁻ epitaxial layer 4 for electrically isolating this portion from another element forming region. A p diffusion layer 7 having an impurity concentration of up to $10^{16}$ atoms/cm³ is formed on the surface of the n⁻ epitaxial layer 4 not covered with the LOCOS oxide films 6 and in the vicinity thereof.

An n⁻ diffusion layer 8b having an impurity concentration of up to $10^{16}$ atoms/cm³ and an n⁺ diffusion layer 9b having an impurity concentration of up to $10^{21}$ atoms/cm³ are formed on the surface of the p diffusion layer 7 and in the vicinity thereof. Further, a p⁺ diffusion layer 10a having an impurity concentration of up to $10^{20}$ atoms/cm³ is formed on the surface of the p diffusion layer 7 and in the vicinity thereof for attaining electrical contact with the p diffusion layer 7.

An n⁻ diffusion layer 8a and an n⁺ diffusion layer 9a are formed on the surface of the n⁻ epitaxial layer 4 and in the vicinity thereof. An interlayer insulation film 11 such as a silicon oxide film is formed on the n⁻ epitaxial layer 4 to cover the LOCOS oxide films 6. A contact hole 12a exposing the surface of the n⁺ diffusion layer 9a is formed in the interlayer insulation film 11. Further, a contact hole 12b is formed to expose the surface of the p⁺ diffusion layer 10a. In addition, a contact hole 12c is formed to expose the surface of the n⁺ diffusion layer 9b.

A collector electrode 13a electrically connected with the n⁺ diffusion layer 9a is formed in the contact hole 12a. A base electrode 13b electrically connected with the p⁺ diffusion layer 10a is formed in the contact hole 12b. An emitter electrode 13c electrically connected with the n⁺ diffusion layer 9b is formed in the contact hole 12c.

In the aforementioned structure, the n⁻ epitaxial layer 4 defines a collector region in a bipolar transistor, the p diffusion layer 7 and the p⁺ diffusion layer 10a define a base region, and the n⁻ diffusion layer 8b and the n⁺ diffusion layer 9b define an emitter region.

In this bipolar transistor, the p⁺ diffusion layer 10a formed as a base contact region for attaining contact with the base region in particular extends toward the n⁻ diffusion layer 8b and the n⁺ diffusion layer 9b defining the emitter region, and the p⁺ diffusion layer 10a and the emitter region are arranged at a prescribed interval a.

The prescribed interval a is preferably at least 0.2 µm and not more than 0.5 µm, as described later. Thus, dispersion of a base current in the bipolar transistor is reduced, thereby remarkably reducing dispersion of a current amplification factor.

Figure 2:
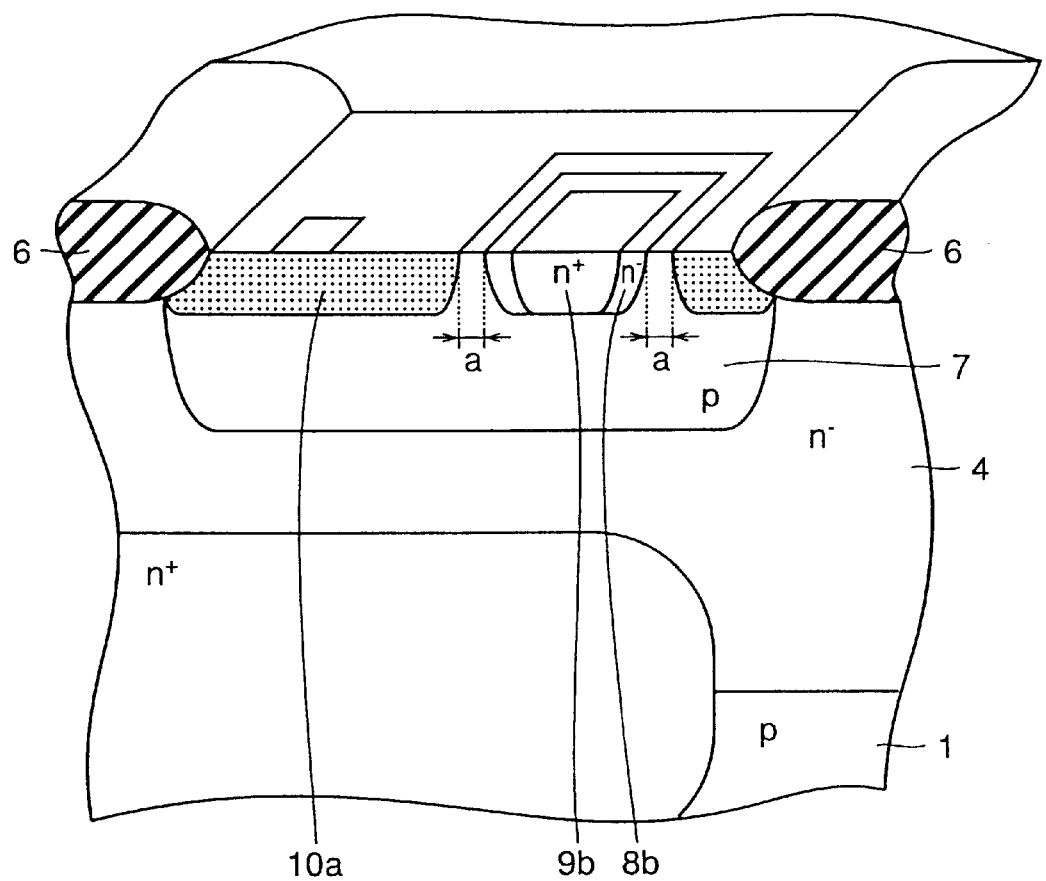
FIG. 2 is a partially enlarged perspective view of the semiconductor device shown in FIG. 1.

The p⁺ diffusion layer 10a is preferably so formed as to enclose the n⁻ diffusion layer 8b and the n⁺ diffusion layer 9b with the prescribed interval a on the major surface and in the vicinity thereof, as shown in FIG. 2

When the p⁺ diffusion layer 10a is formed to enclose the n⁻ diffusion layer 8b and the n⁺ diffusion layer 9b with the prescribed interval a on the major surface and in the vicinity thereof, flows of electrons and holes are uniformalized to stabilize operations of the bipolar transistor.

A method of fabricating the semiconductor device comprising the aforementioned bipolar transistor is now described along with a method of fabricating MOS transistors.

Figure 3:
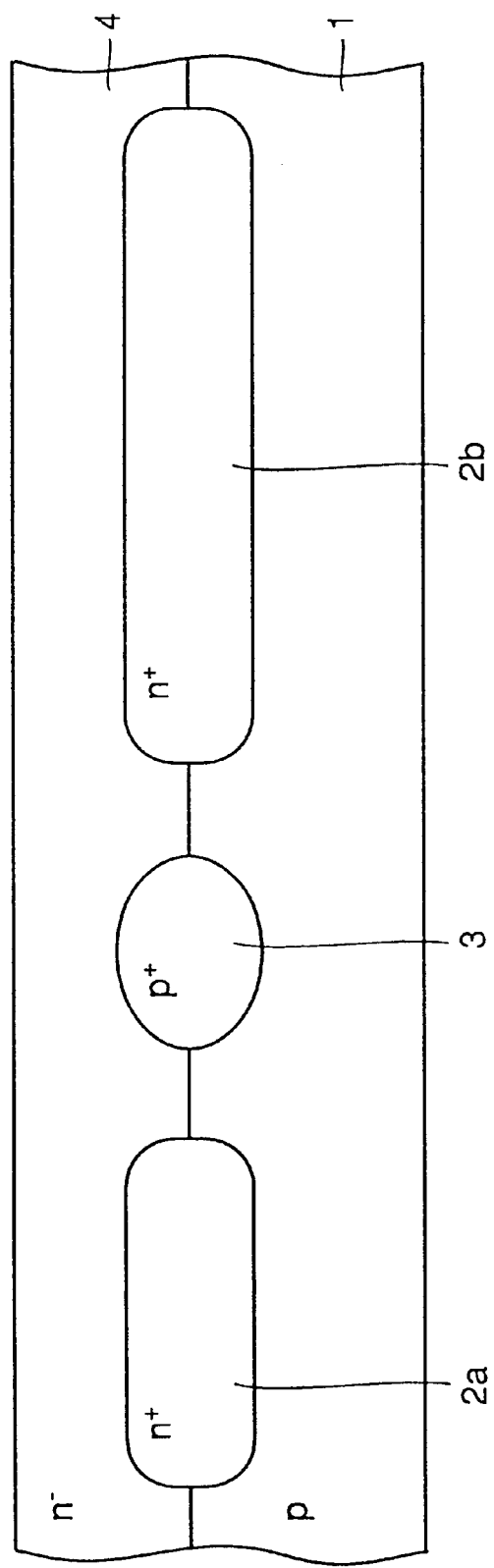
FIG. 3 is a sectional view showing a step of a method of fabricating a semiconductor device including the semiconductor device shown in FIG. 1.

Referring to FIG. 3, the surface of the p-type silicon substrate 1 is oxidized thereby forming a silicon oxide film (not shown). Prescribed photolithography and working are performed on the silicon oxide film for exposing the surface of the p-type silicon substrate 1. Antimony is injected into the exposed surface of the p-type silicon substrate 1 and heat treatment is performed under a temperature of about 1240° C., thereby forming the n⁺ diffusion layers 2a and 2b. Thereafter the silicon oxide film formed on the p-type silicon substrate 1 is removed.

Then, a silicon oxide film (not shown) of about several 10 nm in thickness is formed on the p-type silicon substrate 1 by CVD or the like. Prescribed photolithography and working are performed on the silicon oxide film, for exposing the surface of the p-type silicon substrate 1. Boron is injected into the exposed surface of the p-type silicon substrate 1 and heat treatment is performed under a temperature of about 1100° C., for forming the p⁺ diffusion layer 3. Thereafter the silicon oxide film formed on the p-type silicon substrate 1 is removed.

Then, the epitaxial layer 4 of silicon is formed on the p-type silicon substrate 1 formed with the n⁺ diffusion layers 2a and 2b and the p⁺ diffusion layer 3 by epitaxial growth. At this time, the epitaxial growth is performed under a temperature of about 1150° C., so that impurities contained in the n⁺ diffusion layers 2a and 2b and the p⁺ diffusion layer 3 formed on the p-type silicon substrate 1 thermally diffuse toward the epitaxial layer 4 following growth of the epitaxial layer 3, to provide the structure shown in FIG. 3.

Figure 4:
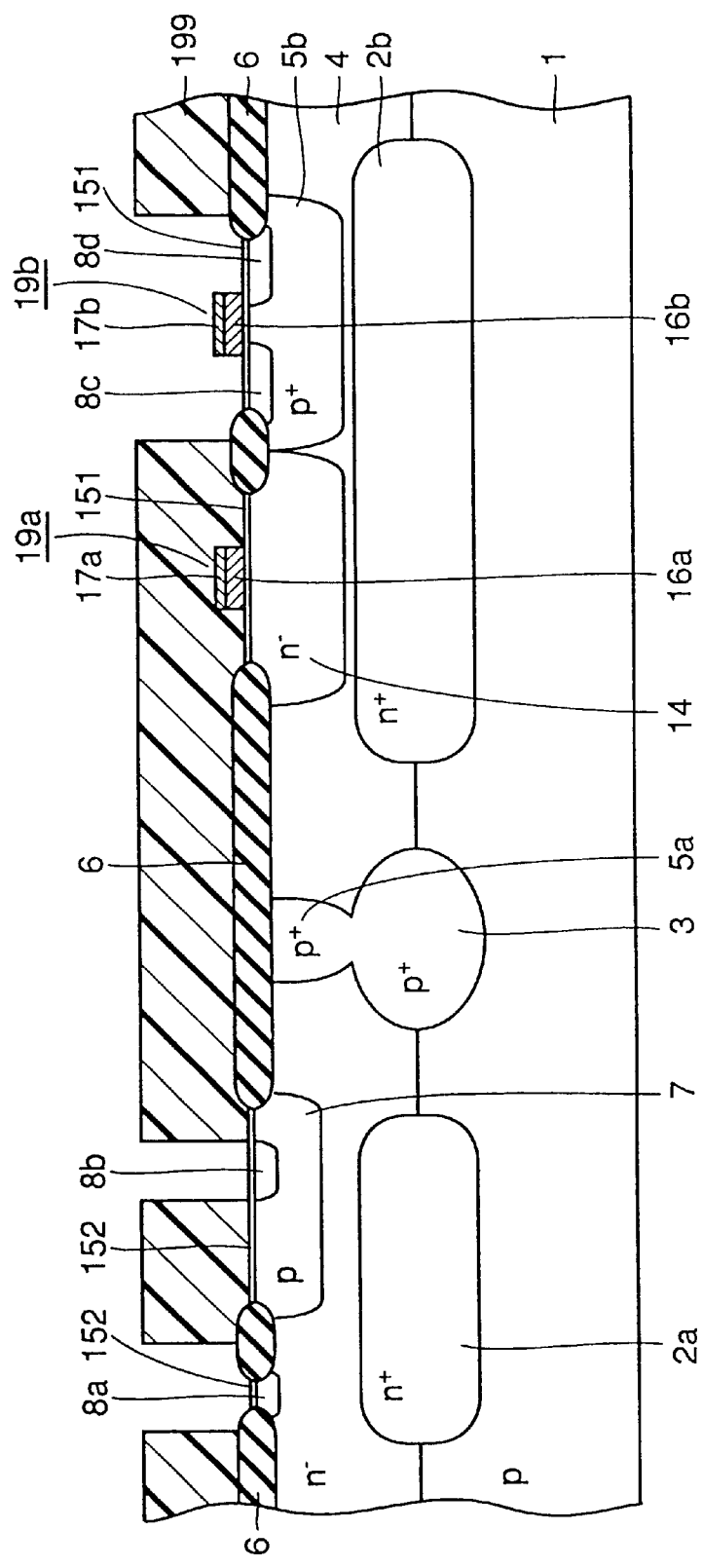
FIG. 4 is a sectional view showing a step carried out after the step shown in FIG. 3 in this embodiment.

Referring to FIG. 4, a silicon oxide film (not shown) of about several 10 nm in thickness is formed on the n⁻ epitaxial layer 4 by CVD or the like. A silicon nitride film (not shown) is formed on the silicon oxide film by CVD or the like. Prescribed photolithography and working are performed on the silicon nitride film for exposing the surface of the silicon oxide film.

Phosphorus is injected into the n⁻ epitaxial layer 4 through the exposed silicon oxide film and thermal oxidation is performed under a temperature of about 950° C. for forming an n⁻ diffusion layer 14 for defining a p-channel MOS transistor.

Thereafter the silicon nitride film is removed. Prescribed photolithography is performed on the silicon oxide film exposed by removing the silicon nitride film for forming a photoresist pattern (not shown). The photoresist pattern is employed as a mask for injecting boron into prescribed regions of the n⁻ epitaxial layer 4. Heat treatment is performed under a temperature of about 1180° C., for forming a p⁺ diffusion layer 5b for defining an n⁻ channel MOS transistor and the p⁺ diffusion layer 5a for element isolation.

Then, the exposed silicon oxide film is removed for exposing the surfaces of the n⁻ diffusion layer 14, the p⁺ diffusion layers 5a and 5b and the n⁻ epitaxial layer 4. A silicon oxide film (not shown) of about several 10 nm in thickness is formed on the exposed surfaces. A silicon nitride film (not shown) is formed on the silicon oxide film. Prescribed regions of the silicon nitride film are removed and heat treatment is performed for forming the LOCOS oxide films 6. Thereafter the silicon oxide film and the silicon nitride film are removed for exposing the surfaces of the p⁺ diffusion layers 5a and 5b, the n⁻ diffusion layer 14, the p diffusion layer 7 and the n⁻ epitaxial layer 4. At the same time, the surfaces of the LOCOS oxide films 6 are also removed by about several 10 nm.

Then, thermal oxidation is performed for forming a silicon oxide film 151 of about 10 to 50 nm in thickness for defining a gate insulator film on the exposed surfaces of the p⁺ diffusion layer 5b and the n⁻ diffusion layer 14 and forming a silicon oxide film 152 on the surfaces of the p diffusion layer 7 and the n⁻ epitaxial layer 4.

A polysilicon film (not shown) is formed by CVD or the like to cover the silicon oxide films 151 and 152. A tungsten silicide film (not shown) is formed on the polysilicon film by sputtering or the like. Prescribed photolithography and working are performed on the tungsten silicide film and the polysilicon film for forming a gate electrode 19a of the p-channel MOS transistor by a polysilicon film 16a and a tungsten silicide film 17a and forming a gate electrode 19b of the n-channel MOS transistor by a polysilicon film 16b and a tungsten silicide film 17b.

Then, prescribed photolithography is performed on the exposed silicon oxide film 152 for forming a photoresist pattern (not shown). The photoresist pattern is employed as a mask for injecting boron into a prescribed region of the n⁻ epitaxial layer 4, thereby forming the p diffusion layer 7 defining the base region of the bipolar transistor.

Then, a photoresist pattern 199 is formed to expose parts of the p⁺ diffusion layer 5b and the p diffusion layer 7 and a part of the surface of the n⁻ epitaxial layer 4. The photoresist pattern 199 is employed as a mask for injecting phosphorus by oblique ion rotational injection (angle of injection: about 45°) for forming n diffusion layers 8c and 8d on the p⁺ diffusion layer 5b, forming the n⁻ diffusion layer 8b on the surface of the p diffusion layer 7 and in the vicinity thereof and forming the n⁻ diffusion layer 8a on the surface of the n epitaxial layer 4 and in the vicinity thereof.

Figure 5:
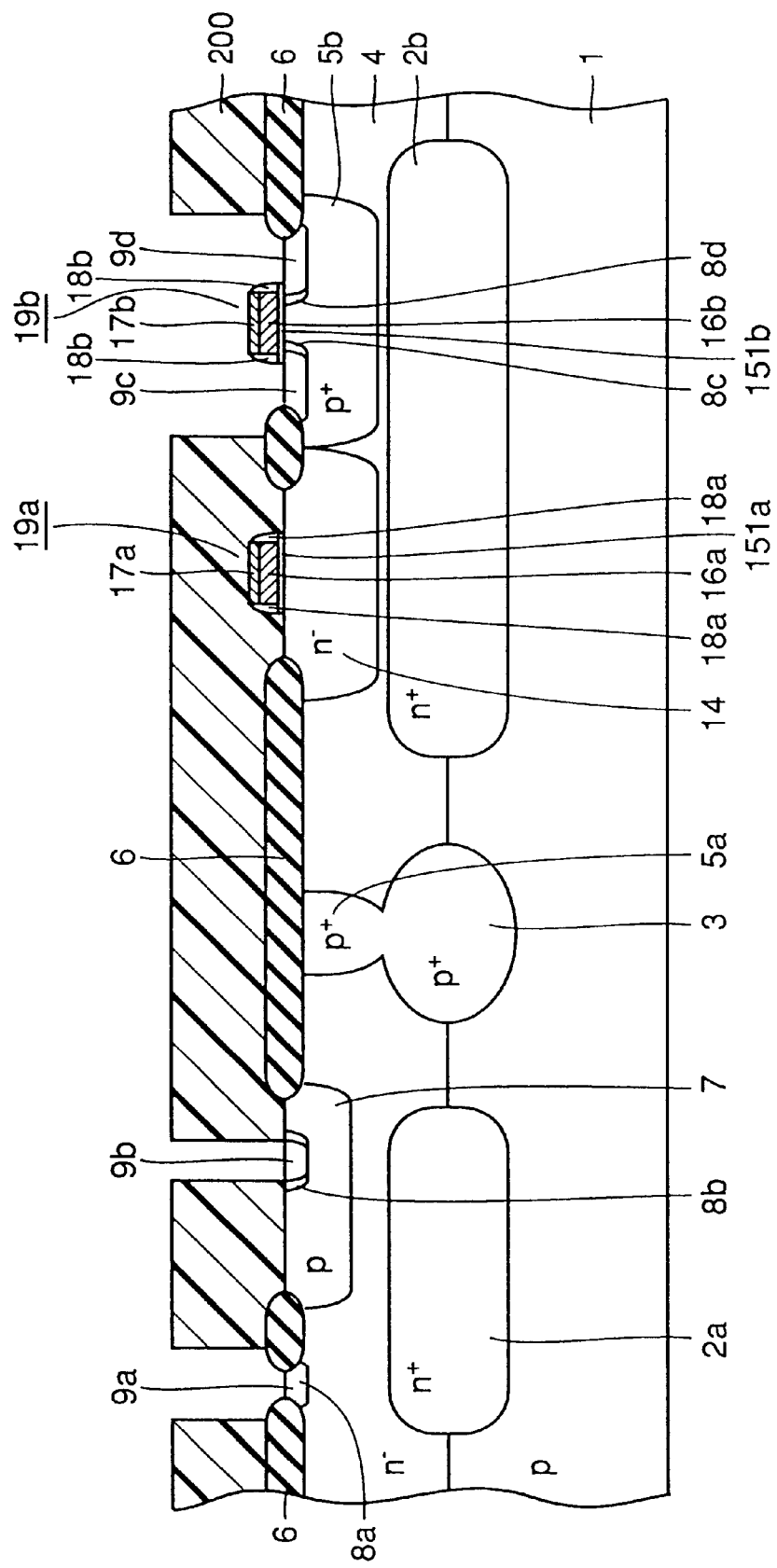
FIG. 5 is a sectional view showing a step carried out after the step shown in FIG. 4 in this embodiment.

Referring to FIG. 5, a silicon oxide film (not shown) is formed by CVD or the like to cover the gate electrodes 19a and 19b. The silicon oxide film is anisotropically etched for forming side wall insulator films 18a and 18b on the side surfaces of the gate electrodes 19a and 19b respectively.

Then, a photoresist pattern 200 is formed to expose a part of the n⁻ diffusion layer 8b and the surfaces of the n⁻ diffusion layers 8c and 8d. The photoresist pattern 200 is employed as a mask for injecting arsenic, thereby forming the n⁺ diffusion layer 9a on the n⁻ diffusion layer 8a, forming the n⁺ diffusion layer 9b on the n⁻ diffusion layer 8b and forming n⁺ diffusion layers 9c and 9d on the n⁻ diffusion layers 8c and 8d. Thereafter the photoresist pattern 200 is removed and heat treatment is performed in a nitrogen atmosphere under a temperature of about 900° C. Thus, the n⁻ diffusion layers 8c and 8d and the n⁺ diffusion layers 9c and 9d define source/drain regions of the n-channel MOS transistor. The n⁻ diffusion layer 8b and the n⁺ diffusion layer 9b define the emitter region of the bipolar transistor. The n⁻ diffusion layer 8a and the n⁺ diffusion layer 9a define a collector contact region for attaining contact with the n⁻ epitaxial layer 4 defining the collector region. In this heat treatment, boron diffuses out particularly from the surface of the p diffusion layer 7.

Figure 6:
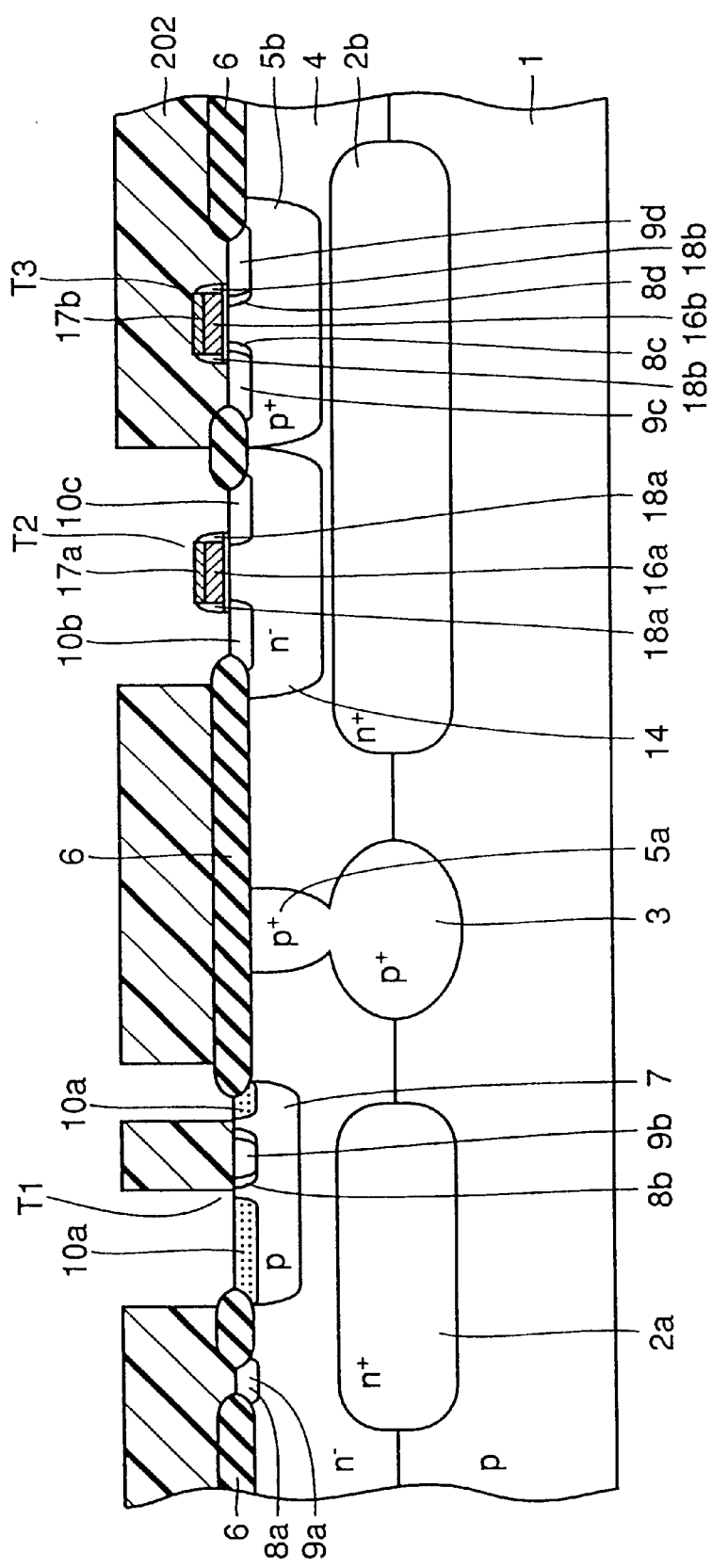
FIG. 6 is a sectional view showing a step carried out after the step shown in FIG. 5 in this embodiment.

Referring to FIG. 6, a photoresist pattern 200 is formed to expose the surfaces of the n⁻ diffusion layer 14 and a part of the p diffusion layer 7. The photoresist pattern 202 is employed as a mask for injecting boron difluoride (BF₂), thereby forming p⁺ diffusion layers 10b and 10c on the n⁻ diffusion layer 14 and forming the p⁺ diffusion layer 10a defining the base contact region on the surface of the p diffusion layer 7 and in the vicinity thereof. The p⁺ diffusion layers 10b and 10c define source/drain regions of the p-channel MOS transistor. The p⁺ diffusion layer 10a defining the base contact region is formed with the prescribed interval a between the same and the n⁻ diffusion layer 8b and the n⁺ diffusion layer 9b defining the emitter region. Thereafter the photoresist pattern 202 is removed.

Thus formed is a bipolar transistor T1 having the collector region defined by the n⁻ epitaxial layer 4, the base region defined by the p diffusion layer 7 and the p⁺ diffusion layer 10a and the emitter region defined by the n⁻ diffusion layer 8b and the n⁺ diffusion layer 9b. Further, a p-channel MOS transistor T2 is formed with the source/drain regions defined by the p⁺ diffusion layers 10b and 10c. In addition, an n-channel MOS transistor T3 is formed with the source/drain regions defined by the n⁻ diffusion layers 8c and 8d and the n⁺ diffusion layers 9c and 9d.

Figure 7:
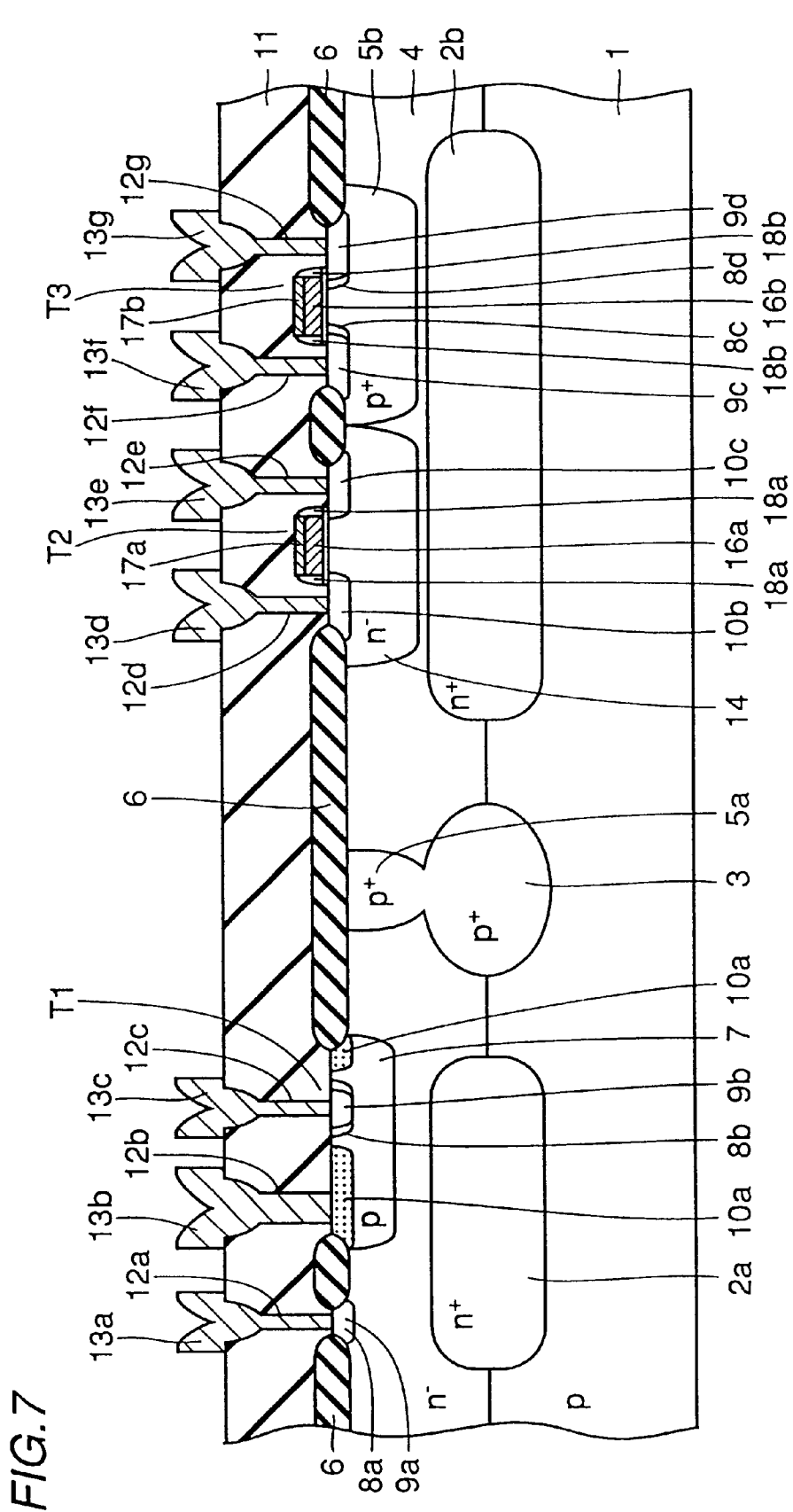
FIG. 7 is a sectional view showing a step carried out after the step shown in FIG. 6 in this embodiment.

Referring to FIG. 7, the interlayer isolation film 11 of a silicon oxide film or the like is formed by CVD or the like to cover the gate electrodes 19a and 19b and the LOCOS oxide films 6. A prescribed photoresist pattern (not shown) is formed on the interlayer insulation film 11. The photoresist pattern is employed as a mask for anisotropically etching the interlayer insulation film 11, thereby forming the contact hole 12a exposing the surface of the n⁺ diffusion layer 9a, the contact hole 12b exposing the surface of the p⁺ diffusion layer 10a and the contact hole 12c exposing the surface of the n⁺ diffusion layer 9b respectively. Further, contact holes 12d and 12e are formed to expose the surfaces of the p⁺ diffusion layers 10b and 10c respectively. In addition, contact holes 12f and 12g are formed to expose the surfaces of the n⁺ diffusion layers 9c and 9d respectively.

The collector electrode 13a is formed in the contact hole 12a. The base electrode 13b is formed in the contact hole 12b. The emitter electrode 13c is formed in the contact hole 12c. Source/drain electrodes 13d and 13e are formed in the contact holes 12d and 12e respectively. Source/drain electrodes 13f and 13g are formed in the contact holes 12f and 12g respectively.

A principal part of the semiconductor device comprising the bipolar transistor T1 and the MOS transistors T2 and T3 is completed in the aforementioned manner.

In the aforementioned semiconductor device, the p⁺ diffusion layer 10a serving as the base contact region extends toward the n⁻ diffusion layer 8b and the n⁺ diffusion layer 9b defining the emitter region, and the p⁺ diffusion layer 10a and the emitter region are arranged at the prescribed interval a.

Figure 8:
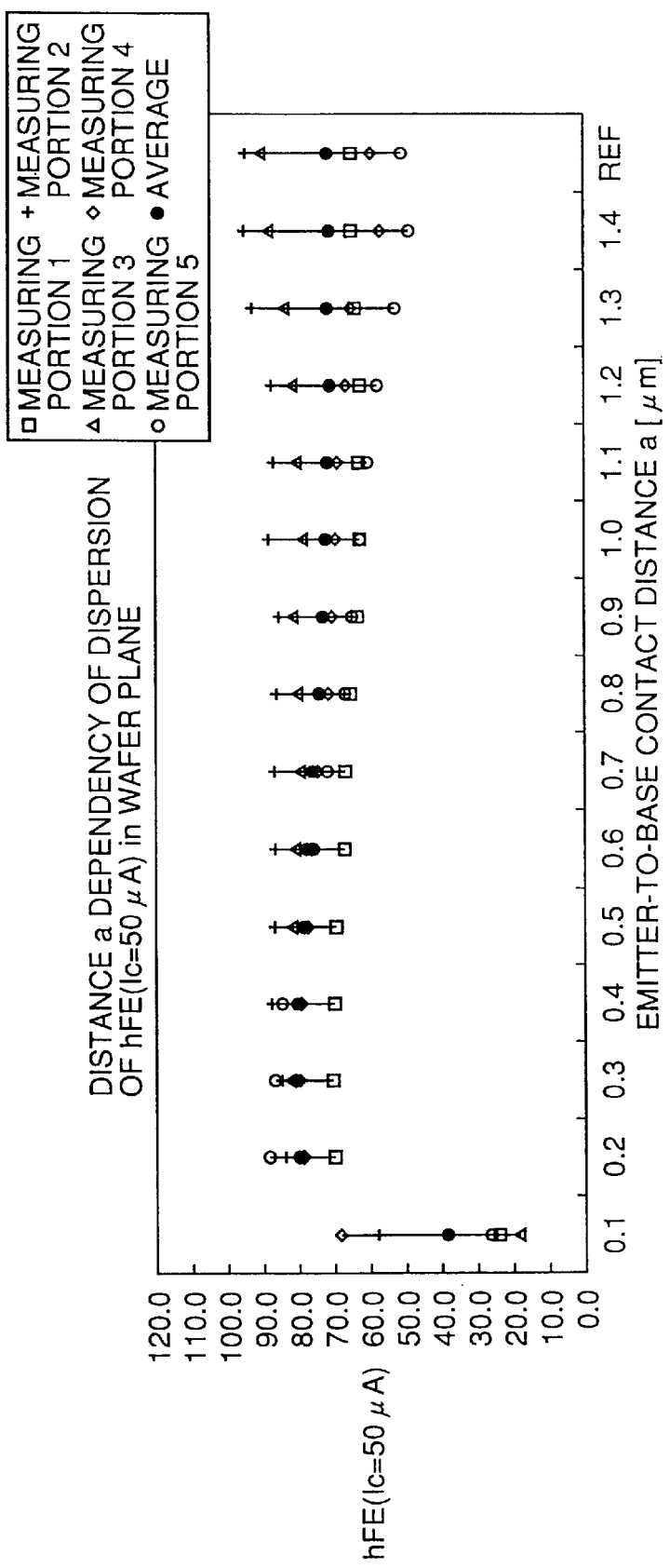
FIG. 8 is a graph showing dispersion of a current amplification factor of a bipolar transistor in the semiconductor device shown in FIG. 1 in this embodiment.
Figure 17A:
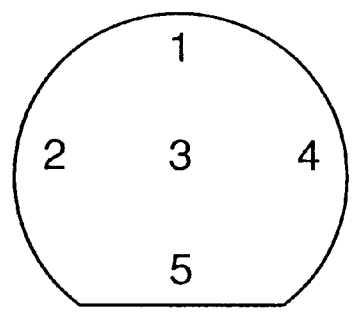
FIGS. 17A to 17F illustrate results of measurement of a current amplification factor of a bipolar transistor in the semiconductor device shown in FIG. 12, with FIG. 17A showing measuring points 1 to 5 in a wafer plane and FIGS. 17B, 17C, 17D, 17E and 17F illustrating results of measurement of the current amplification factor on positions corresponding to the measuring points 1 to 5 shown in FIG. 17A respectively.
Figure 17B:
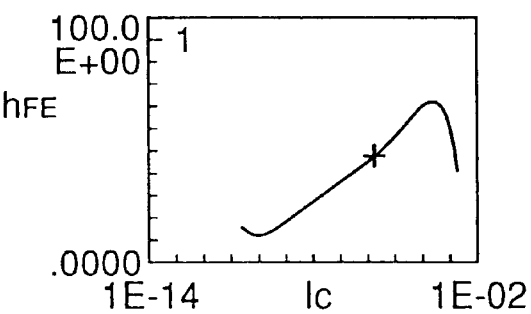
Figure 17C:
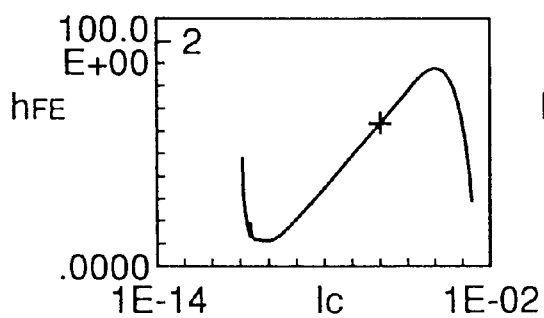
Figure 17D:
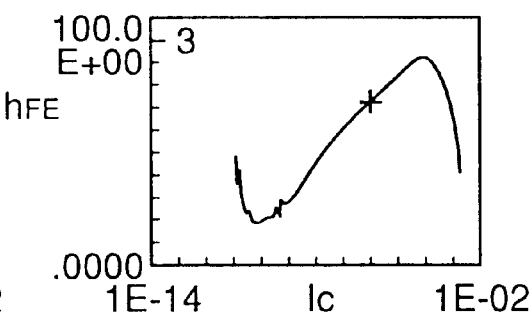
Figure 17E:
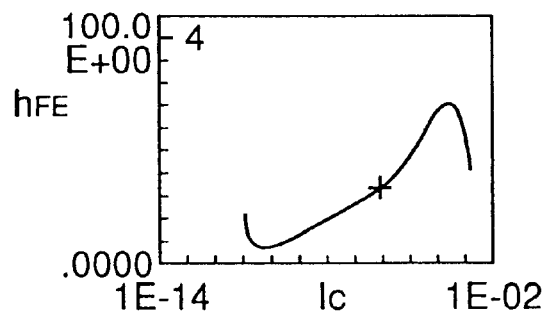
Figure 17F:
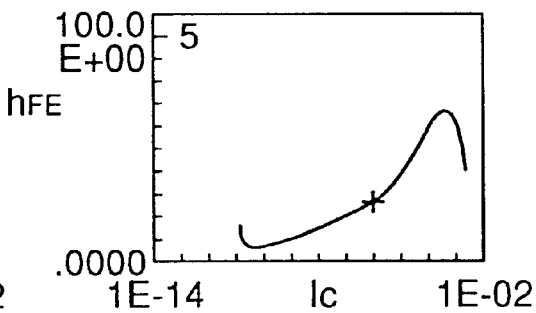
Figure 18:
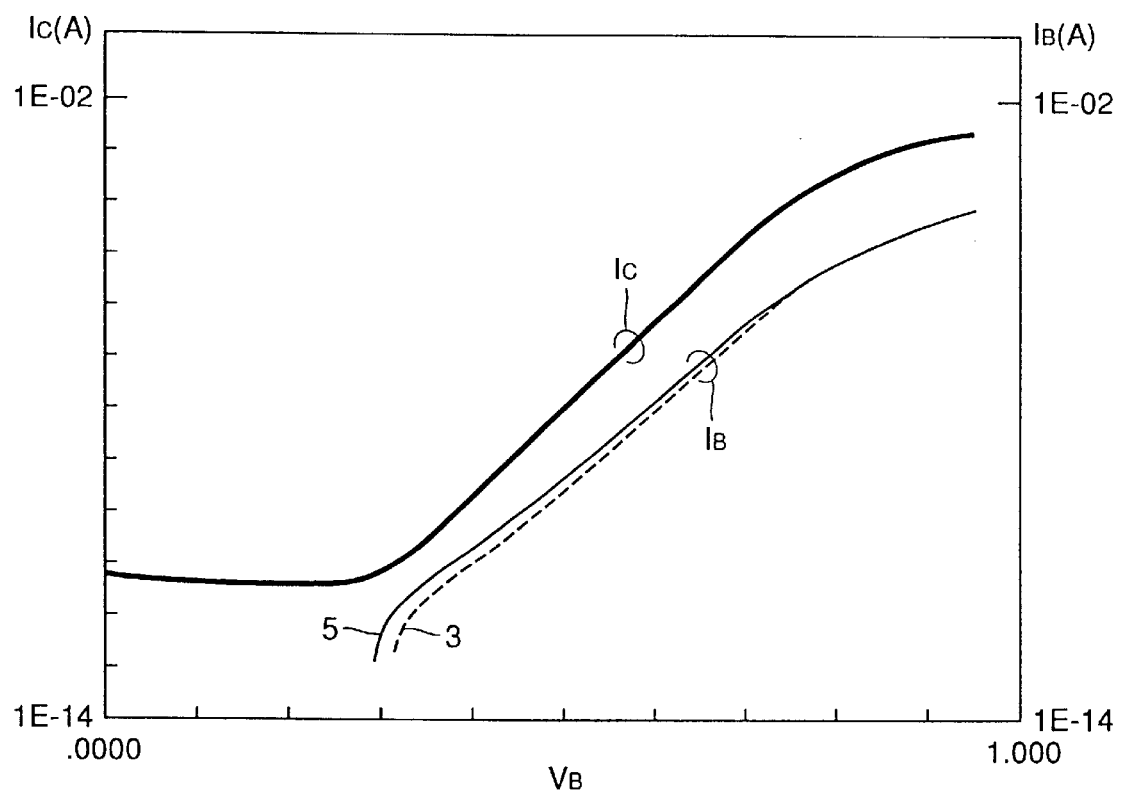
FIG. 18 illustrates results of measurement on the measuring points 3 and 5 shown in FIG. 17A among results of evaluation of base-to-emitter voltage dependency of a collector current and base-to-emitter voltage dependency of a base current.

Dispersion of the current amplification factor of the bipolar transistor T1 in the wafer plane with respect to the interval a between the p⁺ diffusion layer 10a and the n⁻ diffusion layer 8b and the n⁺ diffusion layer 9b was evaluated. FIG. 8 shows the results. Referring to FIG. 8, numerals denoting measuring portions correspond to the measuring points in the wafer plane shown in FIG. 17A. FIG. 8 also shows the results of the current amplification factor measured in the conventional semiconductor device on the right end of the graph for reference.

As shown in this graph, it is understood that dispersion of the current amplification factor in the wafer plane remarkably depends on the interval a. FIG. 9 shows the obtained values of the current amplification factor and average absolute deviation. Average absolute deviation is calculated as:

$$\sigma = (1/n) \ast \Sigma |x_i - x_{ave}|$$

It has been proved from FIGS. 8 and 9 that the interval a is desirably set to at least 0.2 μm and not more than 0.5 μm, in order to reduce the values of average absolute deviation (σ) of the current amplification factor to not more than 5.

While the results were obtained when the collector current 50 μA, similar tendencies were exhibited when the collector current was set to other values.

The aforementioned results are described with reference to the conventional semiconductor device.

It has been described with reference to the prior art that the dispersion of the current amplification factor in the conventional semiconductor device conceivably results from dispersion of the base current.

Figure 10:
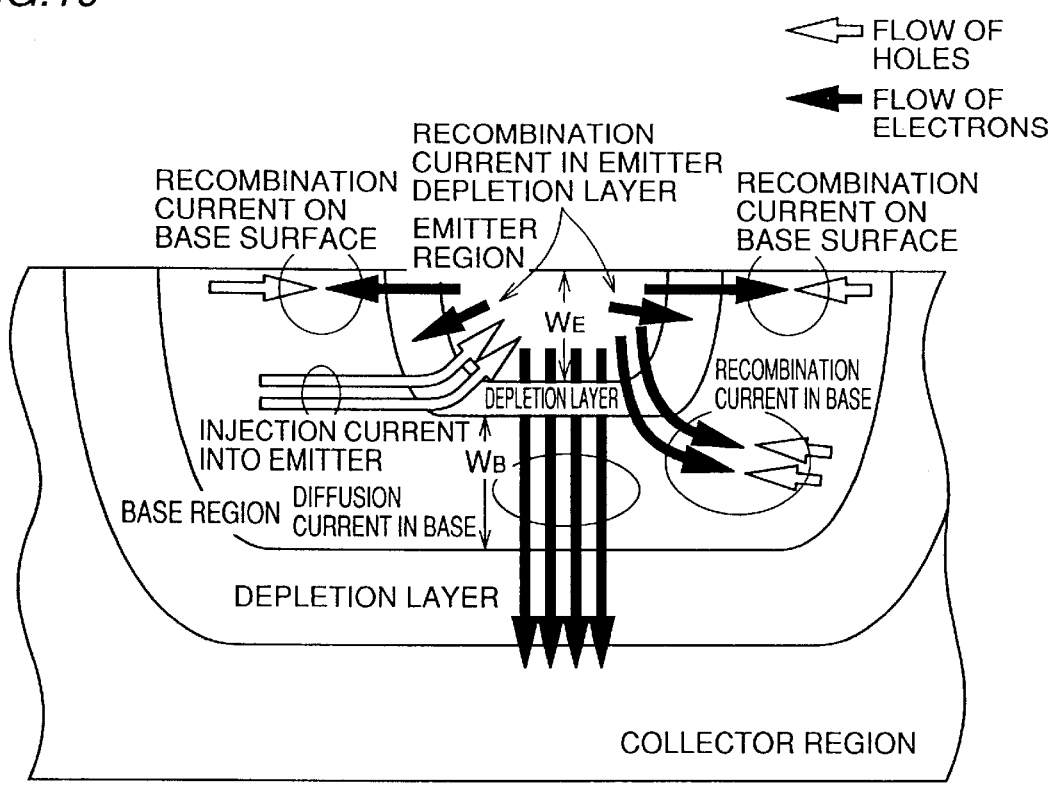
FIG. 10 is a first diagram showing current components in a bipolar transistor.

As shown in FIG. 10, a bipolar transistor has current components including an electron injection component (component 1) into a base region, a hole injection component $I_{diff,E}$ (component 2) into an emitter region, a recombination component $I_{rec}$ (component 3) in an emitter depletion layer, a recombination component αT (component 4) in the base region and a recombination component $I_{sur}$ (component 5) on the surface of the base region.

The quantity of the base current corresponds to the total of the components 2, 3, 4 and 5 among these components. These components are approximately expressed as follows:

$$I_{diff,E} \approx qD_{pE} \cdot n_i^2 / (N_{DE} \cdot W_E) \cdot \exp(qV_{EB}/kT)$$

$$I_{rec} \approx 1/2 \cdot q \cdot (n_i/\tau_o) \cdot W_{EB} \cdot \exp(qV_{EB}/kT)$$

$$\alpha_T \approx 1 - 1/2 \cdot (W_B/L_{nB})^2$$

$$I_{sur} \approx qS_n \cdot (n_i^2/N_{AB}) \cdot \exp(qV_{EB}/kT) \cdot As$$

where $D_{pE}$ represents the hole diffusion constant in the emitter region, $N_{DE}$ represents the impurity concentration in the emitter region, $N_{AB}$ represents the impurity concentration in the base region, $S_n$ represents the surface recombination velocity of electrons, As represents the effective recombination area, $L_{nB}$ represents the electron diffusion length in the base region, $W_E$ represents the emitter width, $W_B$ represents the base width, $W_{EB}$ represents the width of the depletion layer between the emitter and the base, and $\tau_o$ represents the effective life in a reverse bias depletion layer.

Figure 11:
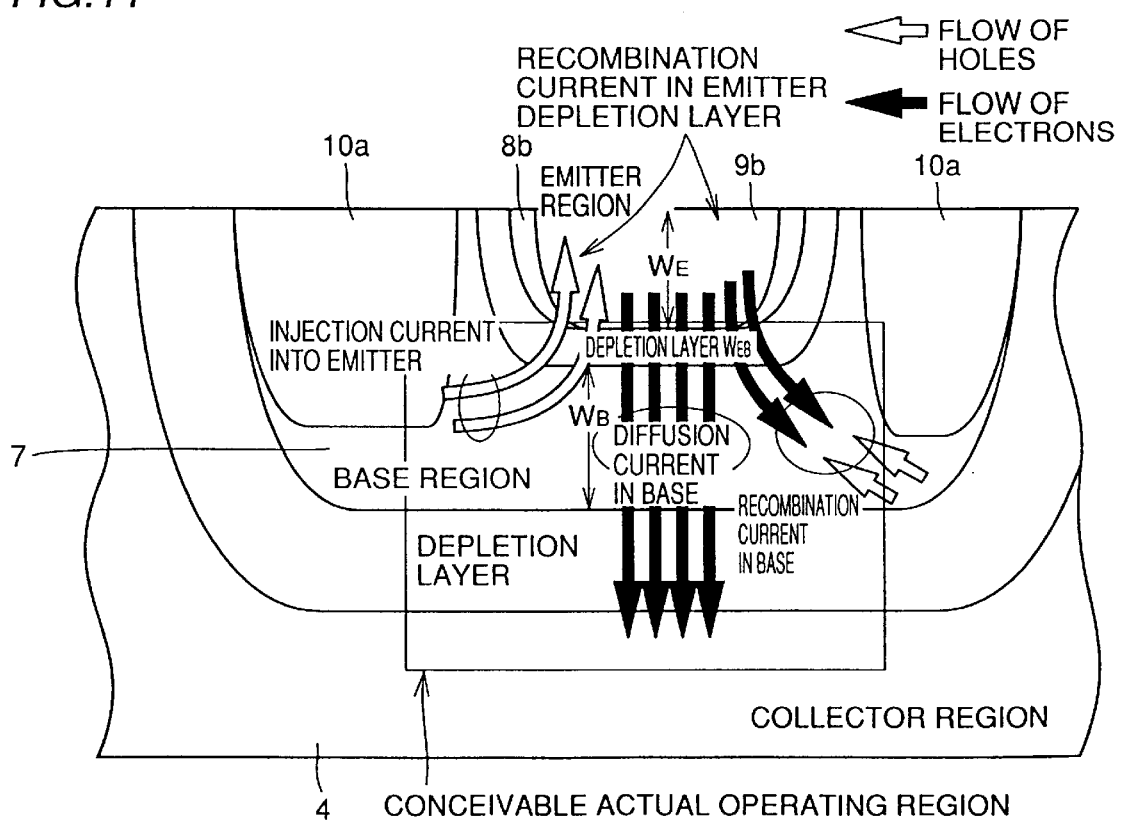
FIG. 11 is a second diagram showing the current components in the bipolar transistor.
Figure 12:
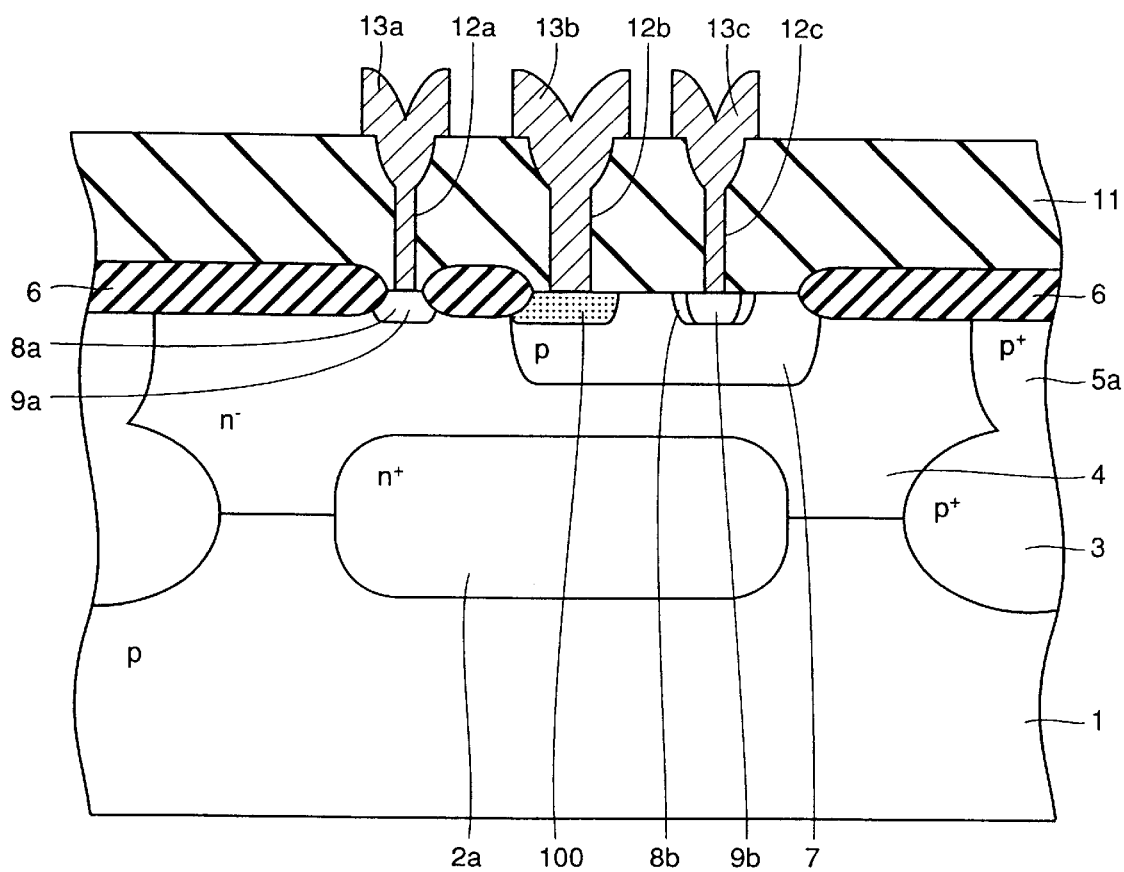
FIG. 12 is a sectional view of a conventional semiconductor device.
Figure 13:
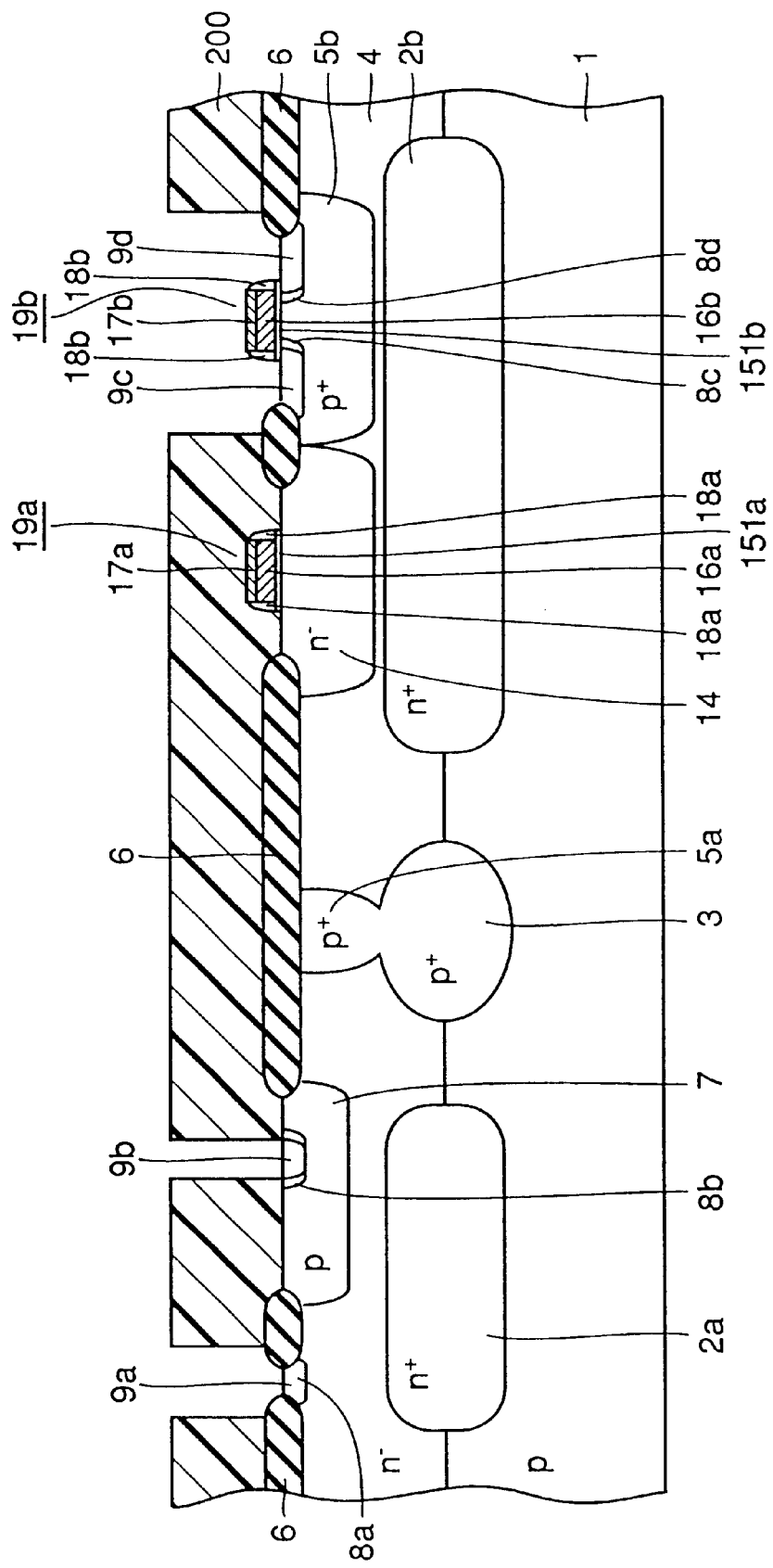
FIG. 13 is a sectional view showing a step of a method of fabricating a semiconductor device including the semiconductor device shown in FIG. 12.

In an actual bipolar transistor, the recombination component $I_{sur}$ (component 5) on the surface of the base region can be ignored in consequence. Thus, the quantity of the base current corresponds to the total of the components 2, 3 and 4, as shown in FIG. 11.

At this time, the current amplification factor $h_{FE}$ is expressed as follows:

$$1/h_{FE} \approx 1/2 \cdot (W_B/L_{nB})^2 + N_{AB} \cdot W_B \cdot Dp_E / (D_{nB} \cdot N_{DE} \cdot W_E) + N_{AB} \cdot W_B \cdot W_{EB} / (2 \cdot D_{nB} \tau_o \cdot n_i \cdot \exp(qV_{EB}/kT))$$

where $D_{nB}$ represents the electron diffusion constant in the base region.

It is understood from the above expressions that the impurity concentration $N_{AB}$ in the base region and the impurity concentration $N_{DE}$ in the emitter region contribute to dispersion of the base current $I_B$.

Figure 14:
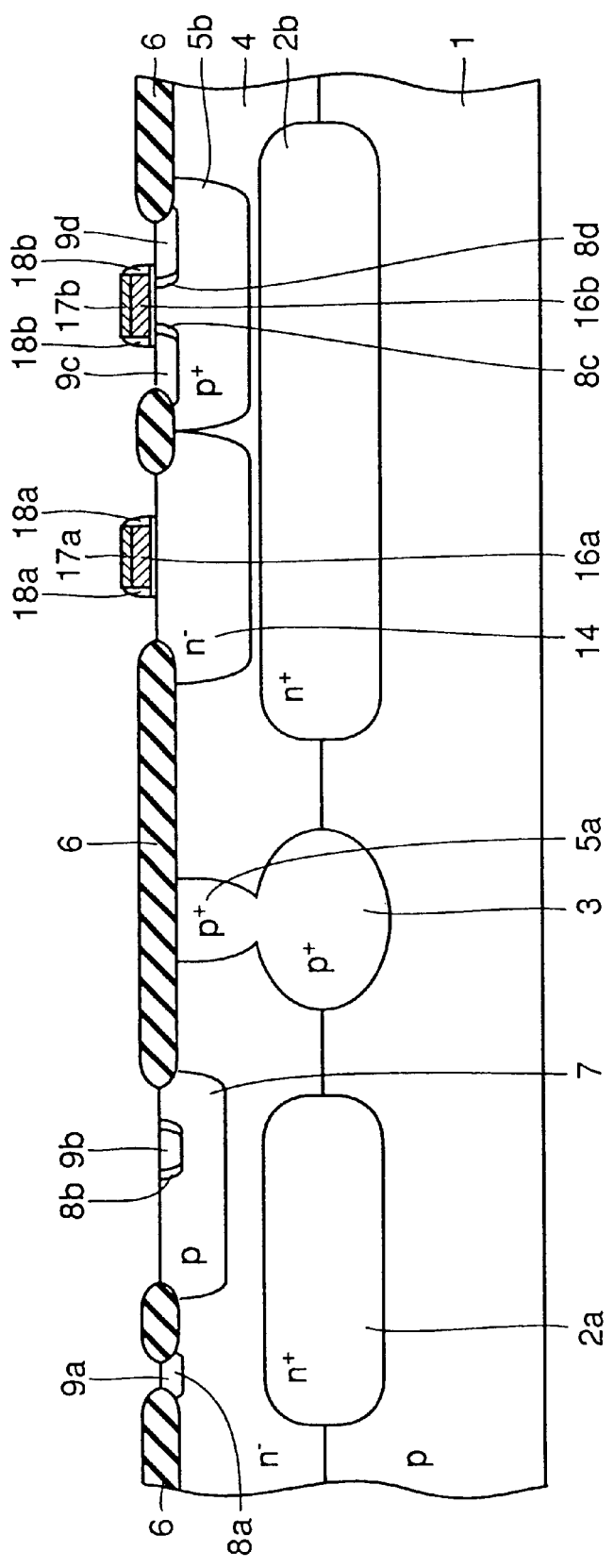
FIG. 14 is a sectional view showing a step carried out after the step shown in FIG. 13.
Figure 15:
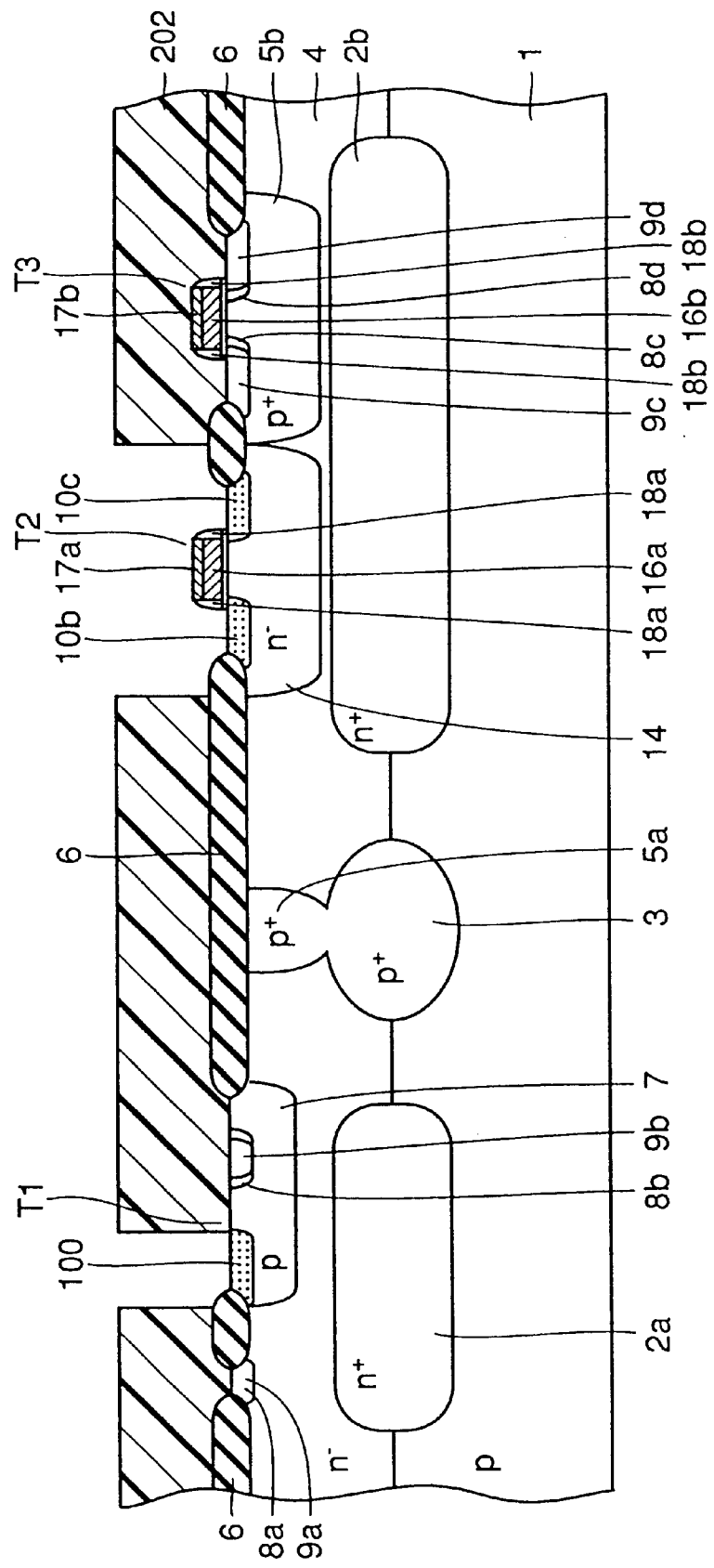
FIG. 15 is a sectional view showing a step carried out after the step shown in FIG. 14.
Figure 16:
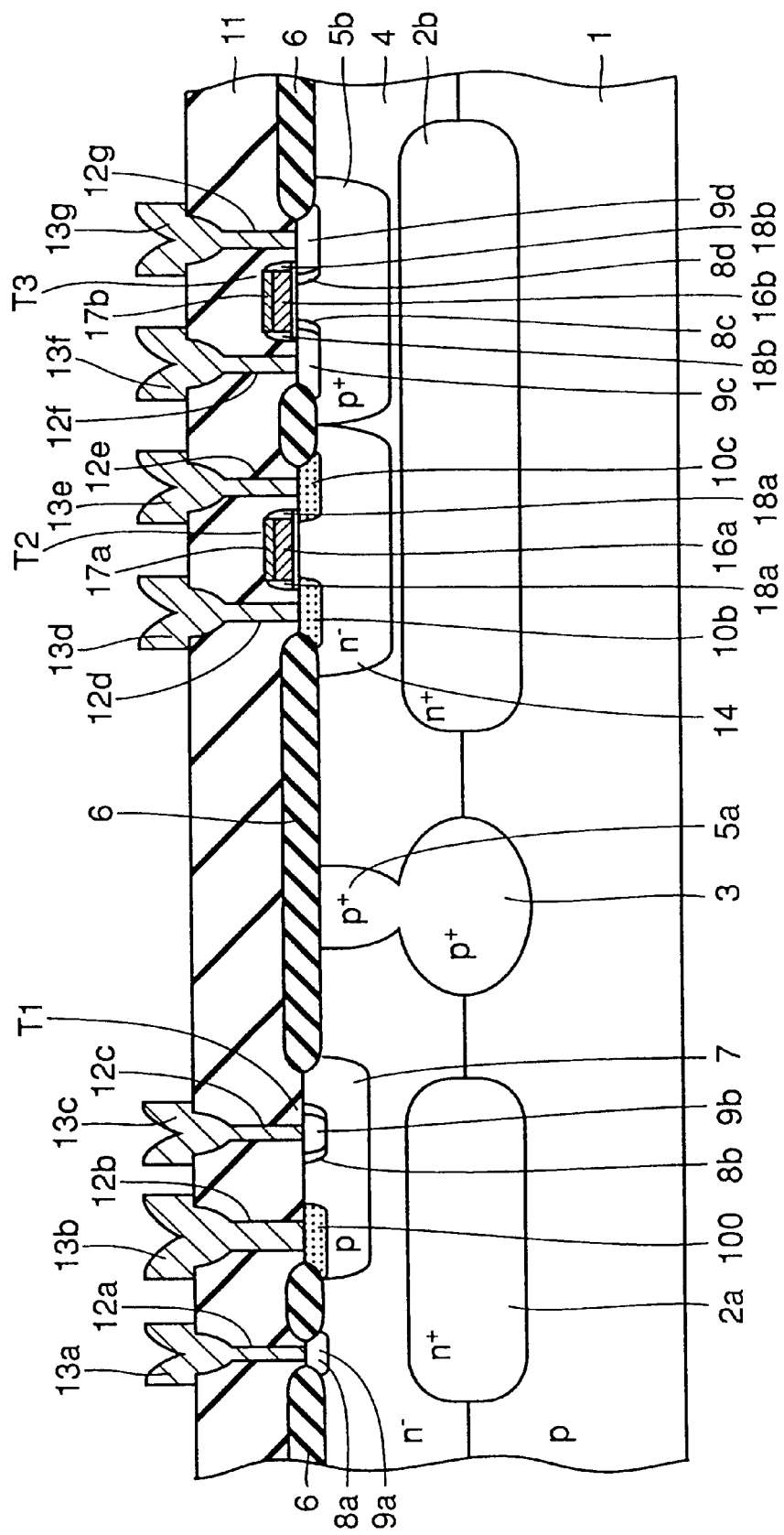
FIG. 16 is a sectional view showing a step carried out after the step shown in FIG. 15.

In the conventional fabrication method, heat treatment is performed in the nitrogen atmosphere in the state exposing the surface of the p diffusion layer 7 defining the base region in the step shown in FIG. 14. At this time, the impurity, i.e., boron diffuses out from the surface of the p diffusion layer 7.

Thus, it is conceivable that dispersion of the impurity concentration of the p diffusion layer 7 remarkably influences dispersion of the base current due to reduction of the impurity concentration of the p diffusion layer 7 and variation of the degree of out diffusion of boron in the wafer plane, to consequently disperse the current amplification factor $h_{FE}$ of the bipolar transistor.

In the semiconductor device according to this embodiment, heat treatment is performed similarly to the step shown in FIG. 14 after the photoresist pattern 200 is removed in the step shown in FIG. 5, so that the impurity, i.e., boron diffuses out from the surface of the p diffusion layer 7.

In the semiconductor device according to this embodiment, however, the p⁺ diffusion layer 10a defining the base contact region extends toward the emitter region defined by the n⁻ diffusion layer 8b and the n⁺ diffusion layer 9b on the surface of the p diffusion layer 7 defining the base region from which boron diffuses out, for supplying the impurity to the p diffusion layer 7 in an amount sufficiently supplementing the outwardly diffusing impurity.

It is conceivable that dispersion of the impurity concentration in the base region including the p⁺ diffusion layer 10a is thus reduced to reduce dispersion of the base current, for consequently reducing the current amplification factor $h_{FE}$ of the bipolar transistor.

It has been recognized that the current amplification factor $h_{FE}$ disperses if the amount of the impurity supplied to the p diffusion layer 7 is excessive or insufficient, and it has been possible to reduce standard deviation of the current amplification factor $h_{FE}$ in the wafer plane to not more than 5% by setting the interval a between the p⁺ diffusion layer 10a and the n⁻ diffusion layer 8b and the n⁺ diffusion 9b to a prescribed value (at least 0.2 μm and not more than 0.5 μm).

Thus, dispersion of the current amplification factor in the bipolar transistor T1 can be remarkably reduced by forming the aforementioned base contact region 10a for obtaining a semiconductor device having stable performance.

It is conceivable that dispersion of the current amplification factor $h_{FE}$ in the wafer plane can be further reduced by improving uniformity of the temperature in the wafer plane when performing the aforementioned heat treatment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising a transistor, wherein said transistor includes:
- a first conductivity type collector region formed on a semiconductor substrate,
- a second conductivity type base region, having a first impurity concentration, formed on the surface of said collector region and in the vicinity of the surface,
- a first conductivity type emitter region formed on the surface of said base region and in the vicinity of the surface, and
- a second conductivity type base contact region, having a second impurity concentration higher than said first impurity concentration, formed on the surface of said base region and in the vicinity of the surface for attaining contact with said base region, wherein
- said base contact region and said emitter region are arranged at a prescribed interval while said base contact region extends into the surface of the base region beside said emitter region, wherein said base contact region is formed to enclose said emitter region on the surface of said base region with said prescribed interval between said base contact region and said emitter region.

2. The semiconductor device comprising a transistor in accordance with claimed 1, wherein dispersion of the value of a current amplification factor is in such a range that the values of average absolute deviation of said current amplification factor on five points in a wafer plane are not more than 5.

3. The semiconductor device comprising a transistor in accordance with claim 1, wherein said prescribed interval between said base contact region and said emitter region is at least 0.2 $\mu$m and not more than 0.5 $\mu$m.

4. The semiconductor device comprising a transistor in accordance with claim 2, wherein said prescribed interval between said base contact region and said emitter region is at least 0.2 $\mu$m and not more than 0.5 $\mu$m.

* * * * *